US 6,543,030 B1

United States Patent
Bao et al.

(10) Patent No.: US 6,543,030 B1
(45) Date of Patent: Apr. 1, 2003

(54) COMPUTER-IMPLEMENTED CONVERSION OF COMBINATION-LOGIC MODULE FOR IMPROVING TIMING CHARACTERISTICS OF INCORPORATING INTEGRATED CIRCUIT DESIGN

(75) Inventors: Liewei Bao, Hoffman Estates, IL (US); Timothy A. Pontius, Lake in the Hills, IL (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/307,165

(22) Filed: May 7, 1999

(51) Int. Cl.[7] .............................................. G06F 17/50
(52) U.S. Cl. ................. 716/2; 716/3; 716/18; 326/41
(58) Field of Search ............................... 326/40, 38, 39; 716/3, 18, 1, 5; 703/28; 68/12.21; 327/99

(56) References Cited
U.S. PATENT DOCUMENTS 5,067,091 A * 11/1991 Nakazawa ..................... 716/3
5,502,402 A * 3/1996 Mehendale ................... 326/40
6,295,636 B1 * 9/2001 Dupenloup .................. 716/18

OTHER PUBLICATIONS

"HDL Synthesis: Synthesis Application Note" SynopSys, Inc., Aug. 1996, pp. 11–27.

* cited by examiner

Primary Examiner—Vuthe Siek
Assistant Examiner—Helen Rossoshek
(74) Attorney, Agent, or Firm—Peter Zawilski

(57) ABSTRACT

The timing characteristics of an integrated circuit design with an original combination-logic module can be potentially improved by moving an input signal with problematic timing in the original module so that it controls an output multiplexer in a revised module. The revised module includes two submodules. The first submodule provides the desired logic result where the late signal is low; the second submodule provides the desired logic result where the late signal is high. The multiplexer is controlled by the late signal so that its output is the desired logic result under steady-state conditions. If there are other input signals requiring timing advancement, the method can be reiterated. The method can be iterated until specifications are met or it is clear that the method cannot meet specifications by additional iterations.

11 Claims, 5 Drawing Sheets

COMPUTER-IMPLEMENTED CONVERSION OF COMBINATION-LOGIC MODULE FOR IMPROVING TIMING CHARACTERISTICS OF INCORPORATING INTEGRATED CIRCUIT DESIGN

BACKGROUND OF THE INVENTION

The present invention relates to computers and, more particularly, to integrated-circuit design. A major objective of the present invention is to provide a method for improving the timing characteristics of an integrated-circuit design including a combination-logic module.

Much of modern progress is associated with the proliferation of computers, which has been made possible by advances in integrated-circuit manufacturing technology. These advances have provided integrated circuits with ever increasing densities of circuit elements—providing, in turn, higher speeds and more functionality per integrated circuit.

Most integrated circuits comprise identifiable functional blocks. Many such functional blocks implement combination logic; in other words, the block has an output that has a present value that is a predetermined function of the present values of plural inputs to the block under steady-state conditions. "Under steady-state conditions" means that the inputs have been held at constant values long enough that the output will not change except in response to a future change at the inputs. (An example of a non-combination-logic block is a counter, since its present output is dependent both on present and prior input values.)

In general, the time the effects of changes in input signals are evident in the output signals varies from input to input. There are three basic causes for this variance. The first source of variance is differing times of arrival of signal transitions at the inputs. Even in a synchronous system where all input changes are to occur within the same clock cycle, the transitions can occur at different phases within the clock cycle.

A second source of variance is "fan-out". A large fan-out signal is one that drives many devices at once, and thus tends to make transitions more slowly than do small-fanout signals, which drive fewer devices. Thus, even if two transitions begin at the same time, the transition driving more devices takes longer to complete its transition. Accordingly, the effect of the slower transition appears later in the output.

The third source of variance is differences in latencies between respective inputs and the output. For example, different signals may have to traverse different numbers of gates; each gate can impose a delay that contributes to the latency.

The variance is a concern since it places a lower bound on the length of a clock cycle. A transition in the signal that is reflected most slowly must be reflected in the output before a subsequent transition in the signal that is reflected most quickly in the next cycle is reflected in the output. Therefore, successive changes in the block inputs must be separated in time by more than the variance in time inputs are reflected in the outputs. Therefore, the clock rate must be correspondingly limited and overall circuit performance limited.

Reducing the variance can thus improve performance. It is sometimes possible to design a block so that inputs associated with late-arriving signals (LAS) also have the shorter latencies so that the effects on output timing offset each other. In this case, the effects in the output of changes in the various inputs appear at nearer in time, facilitating fast, reliable reads.

To shorten design cycles, complex integrated circuits are typically designed by assembling modules selected from functional libraries of modules. Thus, a combination-logic function can be implemented by simply selecting an appropriate module rather than by designing a block from the transistor level. Since the modules in a library are to apply in a variety of contexts, they are typically designed without any advanced knowledge of any difference in the arrival times of input signals. Accordingly, the tendency is to design modules in which the latencies are relatively uniform across the inputs.

Once a module is incorporated into an actual integrated-circuit design, it may be found that the effects on the output of input transitions various from input-to-input to an unsatisfactory or undesirable degree. It is sometimes possible to find a more suitable module for the same function in the module library. Otherwise, it may be necessary to make ad hoc changes to the design or to redesign the functional block from scratch to meet requirements or otherwise optimize the design.

Certain types of modifications to modules have been taught for very specific design situations. For examples, some module libraries contain specific instructions for modifying a module to accommodate certain timing situations, for example, see *HDL Synthesis: Synthesis Application Note*, Synopsys, Inc., August, 1996, Chapter 2, pp. 11–27. However, the scope of such modifications is very narrow.

What is needed is a computer-implemented method for redesigning combination-logic modules to accommodate different signal arrival times at different inputs and thus to improve the timing characteristics of the incorporating integrated circuit. Such a method would improve the competitiveness of modularly designed integrated circuits, on the one hand, and reduce the effort required to achieve high-performance integrated circuits on the other.

SUMMARY OF THE INVENTION

The present invention provides a computer-implemented method for potentially improving the timing characteristics of an integrated circuit design including a combination-logic module. A last signal, e.g., the signal most belatedly reflected in the out put of the original combination-logic module, is identified. The original module is converted to a second module that has two logic submodules and an output multiplexer. One submodule provides the same result as the original module when the last signal is high, while the other provides the same result as the original module when the last signal is low. The last signal is not input to the submodules, but serves as the control signal for the multiplexer so that the revised module implements the same logic function as the original module.

The timing of the last signal is, in general, advanced by moving it from its position as a logic input in the original module to its position as an output multiplexer control signal in the second module. If the timing of the last signal is still not adequate, it is unlikely that the timing specification can be met. However, if the timing of the last signal is adequate, other signals with problematic timing can be addressed by iterating the method.

The combination-logic submodules are readily derived from the original module by applying constant signals to the inputs that formerly received the last input signal. In one submodule, all inputs formerly associated with the last input are held high; in the other submodule the corresponding inputs are held low. In many cases, further improvements in the submodule designs can be effected using more sophisticated design algorithms and/or taking advantage of operator intervention.

Because the last input is not a factor within the submodules, their latencies can be less than the latency for the original module. However, the additional latency due to the multiplexer might cause some latencies across the module to increase. Accordingly, it is generally desirable to test the redesigned module to determine whether a specification has been met or whether an improvement has actually been effected.

The invention provides for a two-pronged testing of revised modules. The first issue is whether the revised module meets predetermined timing specifications. If it does, the method provides for implementing the revised module. Alternatively, the method can be iterated to determine if further improvements to timing might be available.

If the specifications are not met, the second issue arises: is the failure due to the timing of the last signal or another signal. If it is due to the last signal, further iterations of the method are not likely to result in improvements; accordingly, the method can be terminated. If the failure is not due to the last input, further improvements may be achieved by additional iterations of the method.

The Nth iteration of the method involves determining an Nth last signal. The Nth last signal is preferably determined at a respective Nth iteration of the method. It is not necessarily the Nth last signal as determined on the first iteration.

For every iteration of the method beyond the first, there is already an output multiplexer. The Nth last signal, where N>1, becomes a multiplexer control along with previous last signals, and the number of combination-logic submodules doubles. (In some cases, some submodules prove to be degenerate and need not be represented in the revised module.)

For the second and succeeding iterations, there is an option to have the Nth last signal control a new multiplexer stage or share control of a stage previously controlled, at least in part, by the (N−1)st last signal. In a preferred realization, both are tried and tested—with the better one being implemented if they both pass.

In another preferred realization, the Nth last signal is added to the first pre-existing multiplexer stage. If this module fails due to a prior last signal's lateness, it can be assumed that the additional complexity of the first stage causes a prior last signal controlling the first stage to fall below specification. Accordingly, a new stage can added to the multiplexer to be controlled by the Nth last signal. This restores the prior last signal to a situation in which its timing was previously found satisfactory. On the other hand, the present late signal must traverse an extra multiplexer stage. Accordingly, the timing of the present late signal might fail even though it was satisfactory before the new stage was added. However, if it fails, the method is stopped because it is already determined that controlling a subsequent stage with the present late signal would not yield satisfactory results.

If the method is taken to its extreme conclusion, the result is a look-up table having the module inputs as address lines, and the entries the precalculated results of logic operations. In practice, the method would be terminated well before this result. Accordingly, the invention provides for setting an iteration threshold T that corresponds to the number of module inputs that will remain as submodule inputs (and not multiplexer inputs) after an iteration is complete. T can be selected so that $0 \leq T < P$, where P is the number of module inputs. The method provides for halting the iterations when the number N of iterations is greater than P−T. Preferably, T is at least one-half P.

The invention provides for different methods of determining lateness. The parameter of greatest interest is generally the relative time a change in a logic input signal is appropriately reflected in the logic output. In general, the most important factor for a standard logic module is the time of arrival of the inputs from upstream components of the incorporating integrated circuit. However, input fan-out and latency across the module can also be included in the determination of lateness.

A major advantage of the inventive method is its applicability to combination-logic modules generally. This is in contrast to prior art methods that apply only to a narrow range of module types. A second major advantage of the invention is that it is straightforward. The invention provides at least one way to revise a module that involves no judgement. On the other hand, the method provides for further improvements using more sophisticated computer design principles or human invention. Because the method is straightforward, it can be completely automated, if desired, to optimize design efficiency. These and other features and advantages of the invention are apparent from the description below with reference to the following drawings.

BRIEF DESCRIPTION OF THE DRAWINGS

(In FIG. 2, method terminations are collapsed into decision diamonds.)

In FIGS. 3–6, module inputs and outputs are labelled by the names of the signals they carry.

DETAILED DESCRIPTION OF THE PREFERRED EMBODIMENTS

Figure 1:
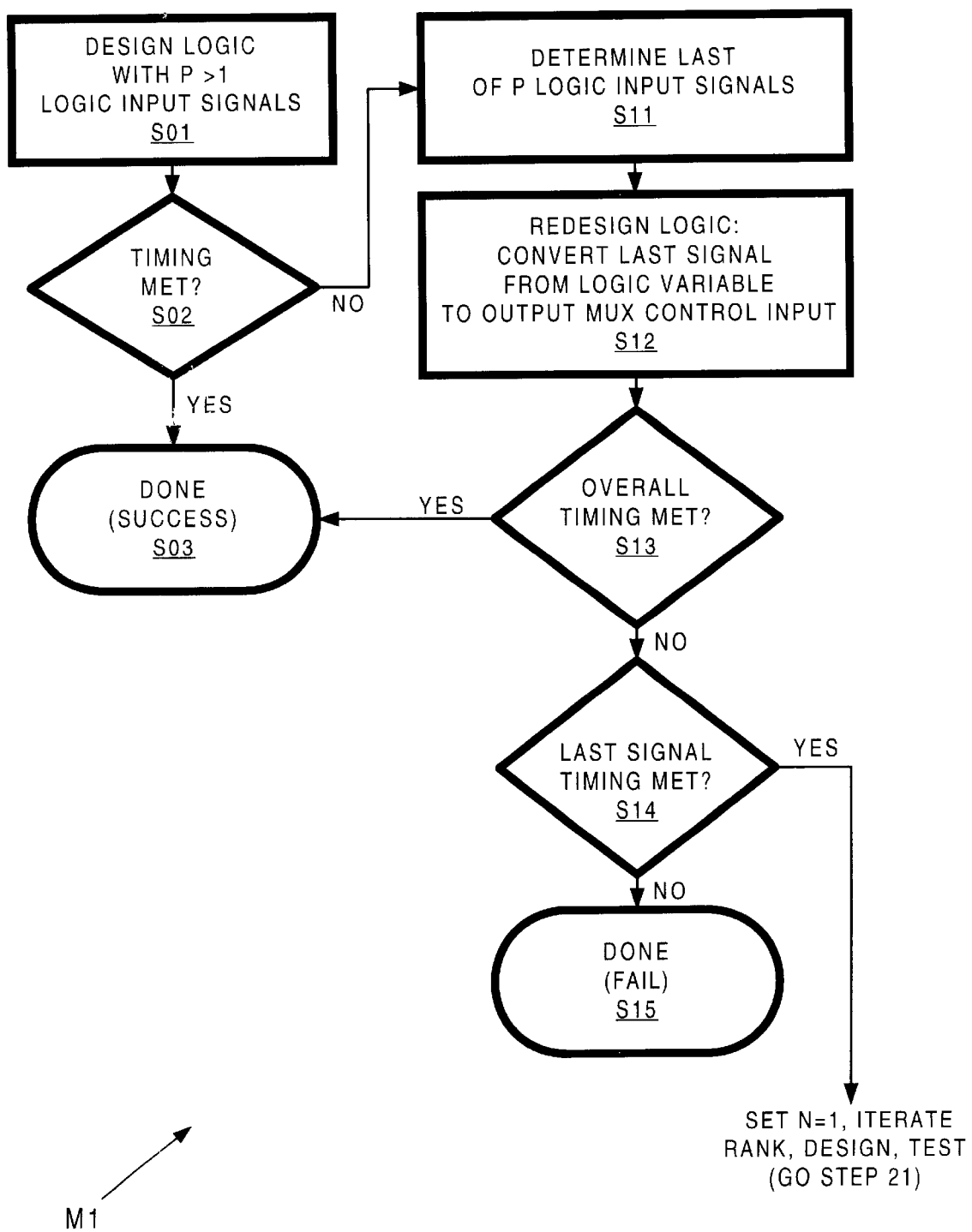
FIG. 1 is a flow chart of a first iteration of a method in accordance with the present invention.
Figure 2:
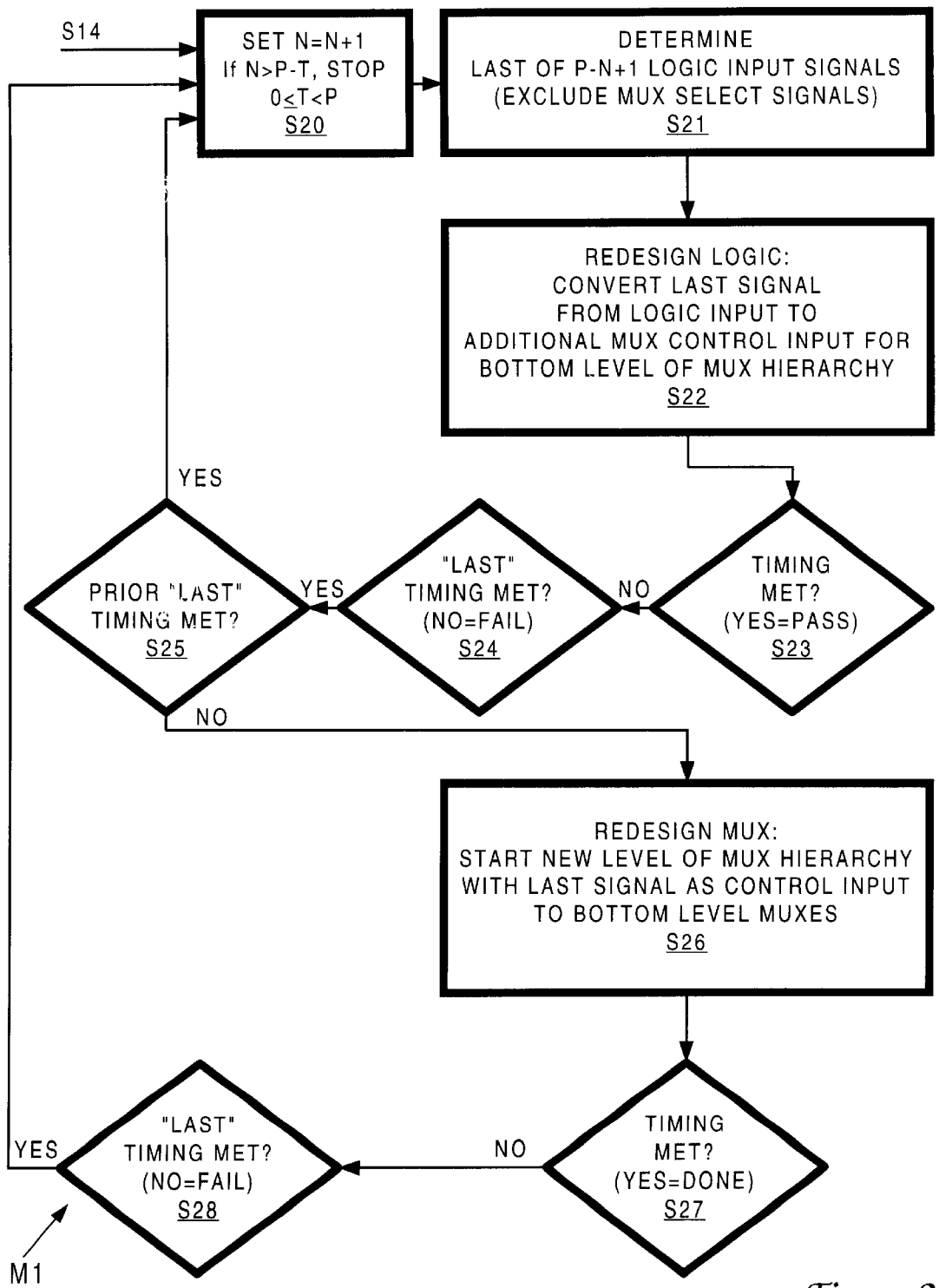
FIG. 2 is a flow chart of subsequent iterations of the method of FIG. 1.
Figure 3:
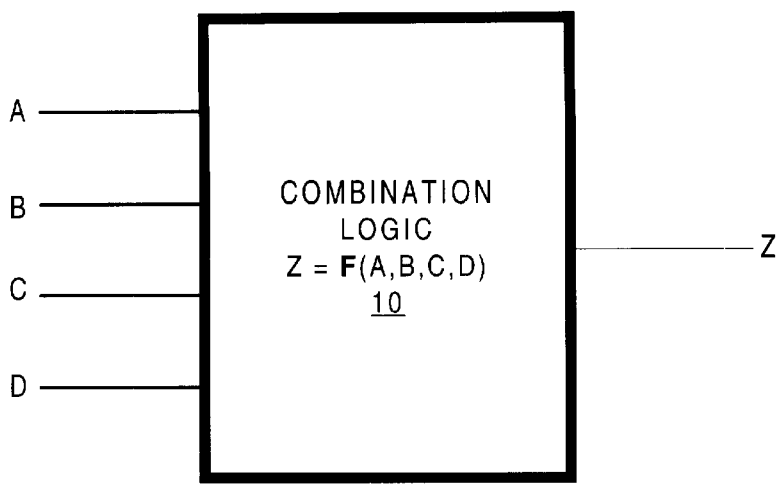
FIG. 3 is a block diagram of an original (first) combination-logic module prior to application of the method of FIGS. 1 and 2.

A method M1 of the invention is flow-charted in FIGS. 1 and 2. A first iteration is flow-charted in FIG. 1. A first preliminary step S01 involves designing a combination-logic module 10, shown in FIG. 3, with four module inputs that respectively receive signals A, B, C, and D, and one module output that transmits a result signal Z. Module 10 implements a logic function of the form Z=F(A,B,C,D) when in a steady-state condition. A second preliminary step S02 involves testing module 10 to determine if timing specifications are met. If timing specifications are met, preliminary step S03 involves a successful original implementation and method M1 proper need not be carried out.

If, on the other hand, the result of preliminary test step S02 is negative (or if further optimization is desired), the first iteration of method M1 begins with a step S11 of determining a last input signal. In this embodiment, the last signal is the last-arriving signal. If there is more than one last-arriving signal, the one with the greater fan-out is the last signal. If there are two or more signals that arrive last and have equal fan-outs, the one with the greater latency across module 10 is the last signal. If two inputs are in every respects equal, one is arbitrarily selected as the last signal. In this case, input "A" is determined to be the last signal.

Figure 4:
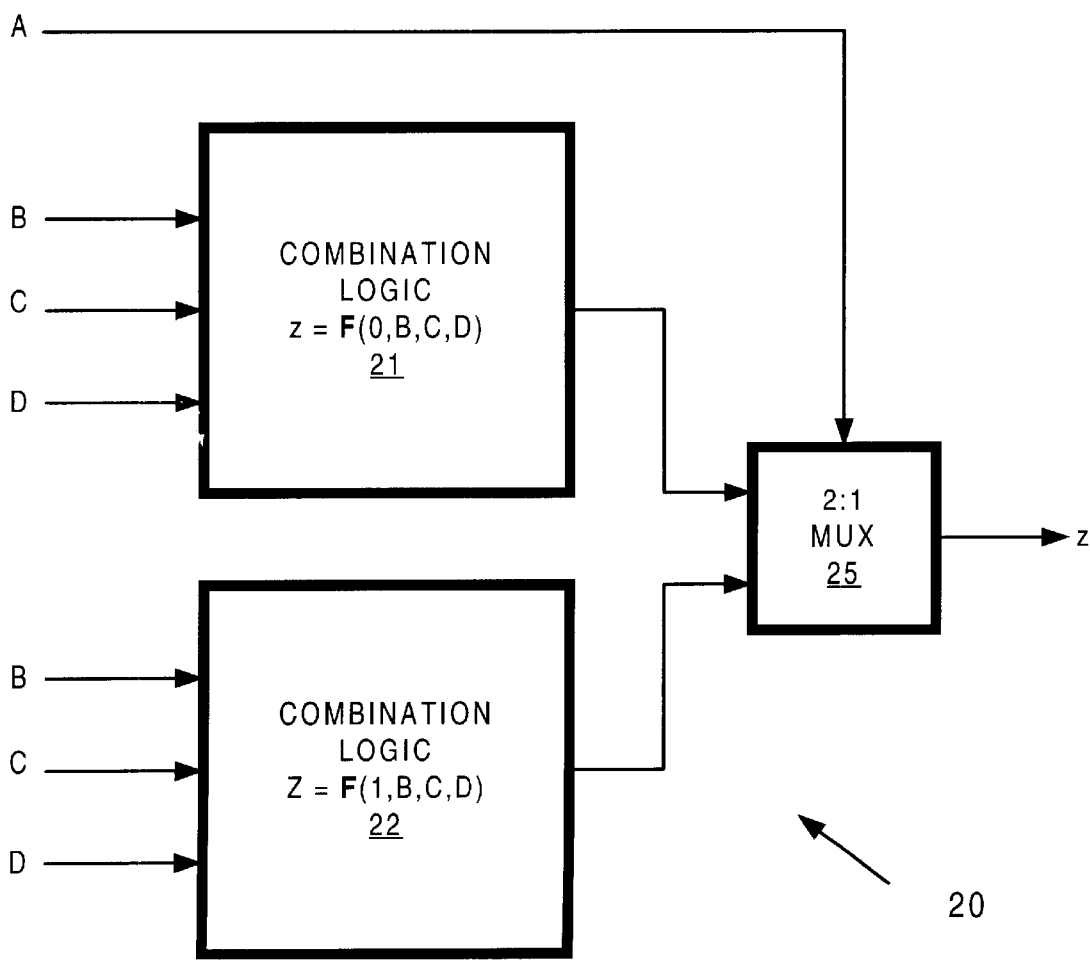
FIG. 4 is a block diagram of a revised (second) combination-logic module resulting from the module of FIG. 3 after application of the first iteration of the method as flow-charted in FIG. 1.

Step S12 involves converting the original design module 10 to a revised design module 20, shown in FIG. 4. Revised module 20 comprises a first combination-logic submodule 21, a second combination-logic submodule 22, and a 2:1 multiplexer 25. Multiplexer 25 has an output that provides result signal Z, two signal inputs coupled to respective outputs of submodules 21 and 22, and a control input that receives signal A.

Submodule 21 implements the combination function of module 10 when input A is held low. Submodule 21 can be derived from module 10 in a straightforward manner (and thus without operator intervention) by grounding all inputs that receive signal A in module 10. Complimentarily, submodule 22 implements the combination function of module 10 when input A is held high. Submodule 22 can be derived from module 10 by holding high all inputs that receive signal A in module 10.

No signal latency across either submodule 21 or 22 should exceed the latency across module 10 if the most straightforward revision is implemented. In general, there can be more optimal designs for the submodules using a more sophisticated automated design algorithm and/or taking advantage of human intervention.

Depending on the value of signal A, one of submodules 21 and 22 outputs the result desired for result signal Z of module 20. Accordingly, signal A is used as the control signal for output multiplexer 25. Note that the latency for signal A in revised module 20 is merely from the multiplexer control input to the multiplexer output. This latency should be substantially less than the original latency. The issue is whether the latency reduction is sufficient to offset the specification failure of module 10.

This sufficiency is tested in two parts in steps S13 and S14, respectively. Step S13 evaluates the overall timing performance of module 20. If specifications are met, method M1 is successfully concluded at step S03.

If module 20 fails the test of step S13, a determination is made at step S14 if the failure is due, at least in part, to the lateness of last signal A. If failure is due at least in part to the lateness of the last signal A, method M1 is halted at step S15; further iterations of method M1 are not designed to advance the timing of last signal A.

However, if the failure at step S13 is not at all due to the timing of signal A, method M1 proceeds to further iterations as flow-charted in FIG. 2. Below, a second iteration is described first, then FIG. 2 is generalized to subsequent iterations.

Step 20 is a conceptual step involving iteration count. P is the number of module input signals. N is the number of the present iteration. At the beginning of an iteration, there are N−1 multiplexer control signals and P−N+1 submodule input signals that are candidates for the next last signal; once the next last signal is selected, there are N multiplexer control signals and P−N submodule inputs. In the case of module 10 there are P−N+1=4−1+1=4 module inputs and N−1=1−1=0 multiplexer inputs. At the end of the first iteration and at the beginning of the second iteration, module 20 has P−N+1=4−2+1=3 submodule input signals and N−1=2−1=1 multiplexer control input signals.

Step S20 includes an embedded iteration stop decision: method M1 stops when the number of iterations N is greater than the difference between the number of module inputs P and threshold value T. T is a preset termination threshold that can range from 0 to P−1. In effect, T sets a lower bound to the number of non-multiplexer module inputs that must remain after an iteration. Setting T equal to 0 maximizes the number of iterations that can be allowed. For illustrative purposes, T is set to 0 in method M1. In general, a higher T would be more practical. For example, T would preferably be between P/2 and P−1. In the case of a four-input module such as module 10, T might be set to 3 allowing one iteration, or to 2, allowing two iterations. In this description, T=2, allowing two iterations. However, a general description is also provided for an Nth iteration.

Step S21 corresponds to first-iteration step S11 and involves determining a second last signal. The previously determined first last signal A is excluded from consideration, so only the three remaining signals B, C and D are compared. In this case, the $2^{nd}$ last signal is B.

Figure 5:
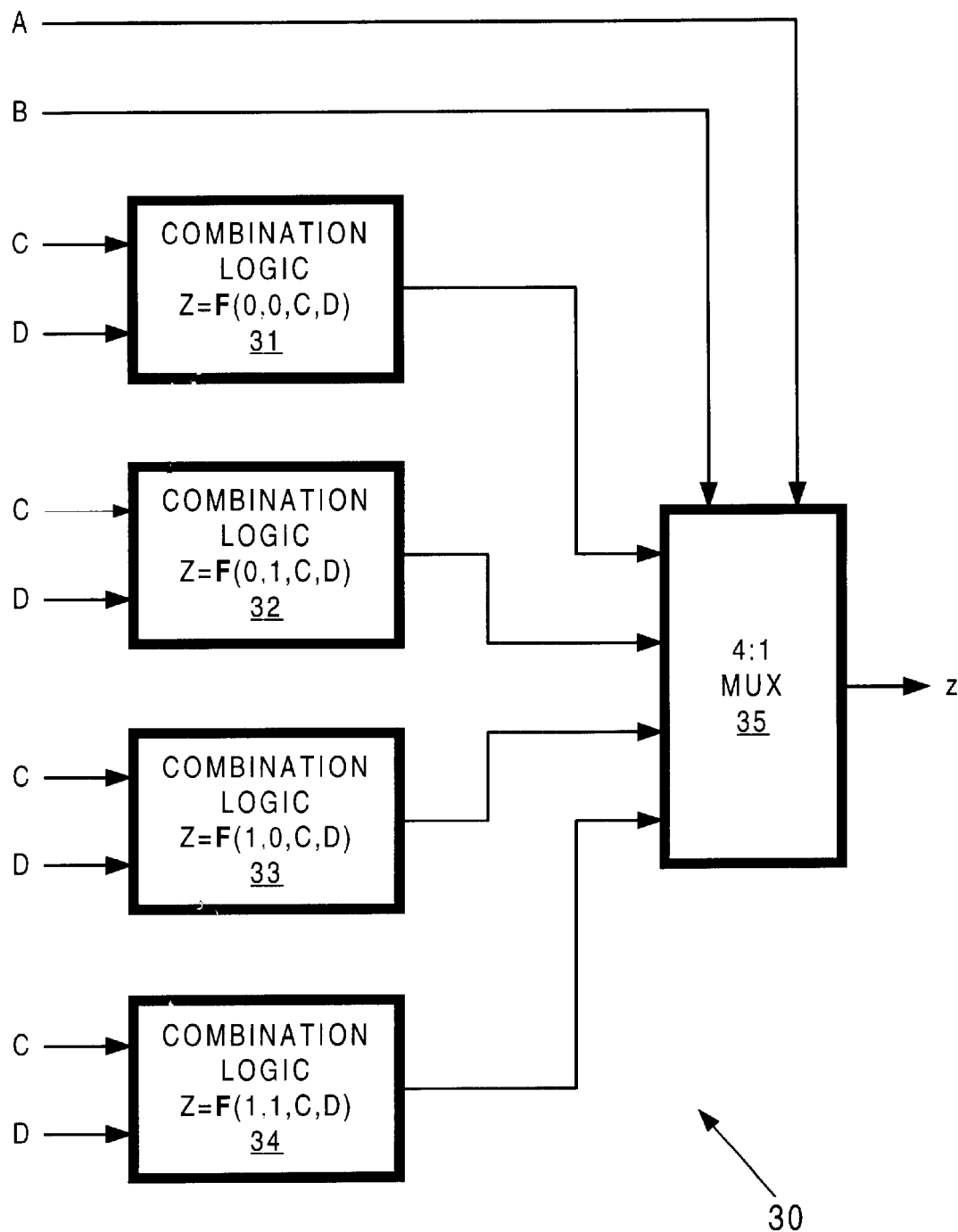
FIG. 5 is a block diagram of a third combination-logic module resulting from the module of FIG. 4 after application of the first part of the second iteration of the method as flow-charted in FIG. 2.

Step S22 corresponds to first-iteration step S12 and involves converting module 20 to module 30, shown in FIG. 5. Module 30 comprises four combination-logic submodules 31, 32, 33, and 34, and a 4:1 multiplexer 35. By analogy with the first iteration, submodule 31 is derived from submodule 21 in the case that B=0, submodule 32 is derived from submodule 21 in the case that B=1, submodule 33 is derived from submodule 22 in the case that B=0, and submodule 34 is derived from submodule 22 in the case that B=1. Each submodule has the two inputs that receive signals C and D. (In general, not all submodules need to receive all input signals that are not multiplexer controls.) Each submodule has an output coupled to a respective input of multiplexer 35. Once again, the derivation of revised module 30 is straightforward and subject to complete automation. Also, more sophisticated design algorithms and operator input can be allowed to explore possible optimizations for the submodules.

Multiplexer 35 provides result Z at its output so that the output of module 30 is logically equivalent to the outputs of modules 10 and 20. At any given steady-state condition, one of the four submodules 31–34 provides the desired value for Z. This is because the four submodules correspond to the four possible combinations of values for the two late signals A and B. The appropriate submodule is selected in accordance with the values of A and B at the control inputs of multiplexer 35.

Multiplexer 35 is a single-stage multiplexer in that the latencies associated with the four multiplexer inputs across multiplexer 35 differ at most negligibly. One possible complication is that the additional complexity of 4:1 multiplexer 35 relative to 2:1 multiplexer 25 of module 20 (FIG. 4) can increase the latency of first late signal A. This increase can be due either to decoding logic or additional fan out. In either case, this increase needs to be considered (at step S25) in evaluating the timing performance of module 30.

The timing characteristics of module 30 are evaluated at step S23. If specifications are met, method M1 successfully terminates and the design of module 30 can be implemented. If the specifications are not met, step S24 involves determining whether the failure is due in part to the lateness of the present late signal B. If so, method M1 terminates without finding a design that meets the specification. If not, a further redesign is implemented.

The nature of the redesign depends on the outcome of step S25. Step S25 determines whether or not the failure was due in part to the lateness of signal A. If the failure is not due to the lateness of signal A, method M1 returns to step 20 for the third iteration.

If it is determined at step S25 that the failure in step S23 is due at least in part to signal A, method M1 proceeds to step S26. Module 30 is converted to module 40. Module 40 has the same logic submodules as module 30. Like module 30, module 40 has a 4:1 output multiplexer. However, module 40's output multiplexer 45 has two stages, as opposed to module 30s one-stage multiplexer. Accordingly, 4:1 multiplexer 45 comprises two first stage 2:1 multiplexers 46 and 47, and a second-stage 2:1 multiplexer 48.

First-stage multiplexer 46 receives the outputs of submodules 31 and 32, while first-stage multiplexer 47 receives the outputs of submodules 33 and 34. Both first-stage multiplexers 46 and 47 are controlled by the second late signal B.

Figure 6:
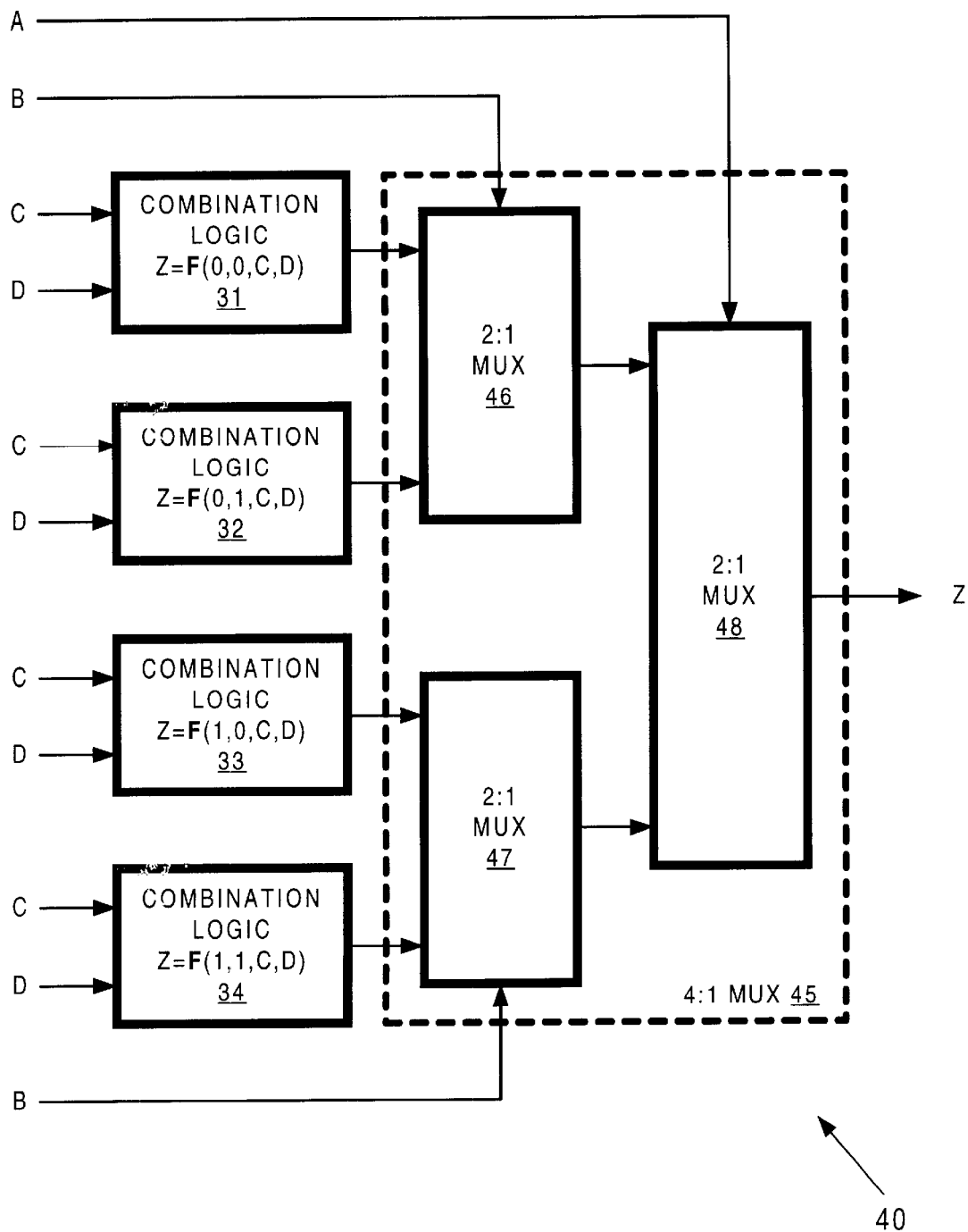
FIG. 6 is a block diagram of a fourth combination-logic module resulting from the module of FIG. 5 after application of the second part of the second iteration of the method as flow-charted in FIG. 2.

The outputs of first-stage multiplexers 46 and 47 are the inputs to second-stage 2:1 multiplexer 48. Second-stage multiplexer 48 is controlled by the first late signal A. Presumably, signal A is problematic in step S23 because of the relative complexity of 4:1 multiplexer 35 (FIG. 5) over 2:1 multiplexer 25 (FIG. 4). In module 40, FIG. 6, signal A is driving only a 2:1 multiplexer 48, so its previously successful timing should be re-established.

Module 40 is tested at step S27. If module 40 meets specifications, method M1 terminates at step S32 with success. Otherwise, method M1 proceeds to decision step S28.

Step S28 determines whether a failure at step S27 is not due, at least in part, to the lateness of one of the last signals A and/or B. It is unlikely that it would be A, since it has been restored to a position in which its timing was previously found satisfactory. In most cases, it is the present late signal B that becomes problematic due to the additional stage interposed between it and the module output. In any event, method M1 does not provide for advancing the timing of a multiplexer input resulting from step S26. Therefore, M1 terminates without meeting specifications if the failure at step S27 is due to a prior or present last signal.

If step S28 determines that the failure at step S27 is due to the timing of a last signal, method M1 returns to step S20 for further iteration. In that case, the timing problem is with the submodule inputs and improvement might be achieved by further redesign. In this iteration, step S20 increments N from 2 to 3. At the beginning of the third iteration, P−N=1. Since the iteration threshold is set to T=2, method M1 halts at this point. If, on the other hand, T were set to 0 or 1, further iterations could be conducted as necessary to meet specifications.

In general, for an original module with P inputs, the Nth iteration begins with step S20 determining whether the number of submodule input signals to advance meets the iteration threshold. If N>P−T, method M1 is halted. Otherwise, method M1 proceeds to step S21.

Step S21 involves determining the last of the signals that are received by submodule inputs in a module tested in the (N−1)st iteration. Step S22 involves converting the prior module so that the Nth last signal joins the (N−1)st last signal in controlling the first stage of an output mux. Step S23 involves testing and passing if specifications are met. Otherwise, method M1 proceeds to step S24.

Step 24 checks to determine if the failure at step S23 is due to the lateness of the Nth last signal. If so, method M1 terminates without meeting specifications. Otherwise, method M1 proceeds to step S25 to determine if the failure was due to a prior last signal. It can be assumed that if the failure is due to a prior last signal, it is a signal that controls the first stage of the output multiplexer, since only the first stage is changed by step S22. If all the timing requirements for the prior last signals are met, at least one of the existing submodule input signals must require advancement. Accordingly, method M1 returns to step S20 for a next iteration.

If step S25 determines that the failure at step S23 is due to a prior last signal falling out of specification, method M1 proceeds to step S26. In this case, the module conversion is limited to a redesign of the multiplexer: the submodules are not changed. The multiplexer is changed by generating an additional stage to the multiplexer. This new stage becomes the first stage, and the stage controlled by the (N−1)st last signal becomes the second stage. The new first stage is controlled solely by the Nth last signal.

This conversion restores the prior late signals to the situation they were in before the modification of step S22. Accordingly, the timing of all the prior last signals should be met. If this results in all specifications being met, as determined in step S27, method M1 terminates successfully. If the test is not passed, method M1 proceeds to step S28.

Step S28 determines if the failure is due in part to the lateness of the present or prior last signals. In general, the failure will not be due to one of the prior last signals, since they have been restored to a position in which their timing was previously found satisfactory. However, step S26 moves the present last signal to a less favorable position, since an additional multiplexer stage has been added between it and the multiplexer output. In any case, method M1 does not provide for advancing the timing of a signal driving a multiplexer control input for a module resulting from step S26. Accordingly, if step S28 determines that a failure in step S27 is due to the timing of a prior or present last signal, method M1 terminates without meeting specifications. Otherwise, method M1 returns to step S20 to begin the (N+1)st iteration.

The present invention provides for many alternatives to the described method. In the illustrated method, there were certain timing requirements that the method attempted to meet. In general, there is no need to stop the method simply because specifications are met. Further improvements may be desired.

In method M1, wherever there are a series of decision steps, the decisions as flowcharted can be combined or reordered in any logically equivalent way. There are three such series including 1) steps S13, S14, 2) steps S23, S24, S25, and 3) steps S27 and S28. For example, steps S28 and S29 can be a single test with three outcomes. For another example, method M1 could first determine whether overall timing is met, as at step S23. If step S23 ends negatively, the next step could determine if the failure was due to any of the last signals. If not, the method could iterate. If so, another step would determine whether or not the present last signal failed. If so, the method would terminate without meeting specifications. If not, the method could continue to step S26.

Alternatively, the method can be used to determine an optimal design. In this case, the method can proceed without regard to success or failure until N=P. The timing characteristics of all modules so generated can then be compared.

Advances in timing characteristics can be weighed against the increased area consumed by the logic. Alternatively, the method can be iterated until some criterion that is a function of circuit area is met.

There are many choices for selecting a "late" signal to be moved from a logic input to a multiplexer control input. Time of arrival, fan out, and latency across the module can all be considered and combined in various ways. In the illustrated case, these criteria were prioritized with lower priority criteria used only to break ties. Alternative, each criterion can be assigned a weight so that, for example, a slightly earlier signal with a much larger fan-out might be selected as the late signal over a later signal with minimal fan-out.

The invention provides for a range of design conversions. The most straightforward redesign involves holding constant inputs assigned to late inputs. However, further simplification can often be achieved. The present invention allows such further simplifications to be entirely automated or facilitated with operator intervention.

In the illustrated embodiment, after the first iteration, all submodules are converted at once. Alternatively, the timing of each submodule can be examined separately. In that case, only the submodules that are problematic need to be revised. In some cases, this can involve one signal being input both to a combination-logic submodule and to a multiplexer control. However, some possible designs are considered that would be overlooked if all submodules must be converted at once.

On the other hand, the method can be executed faster by allowing more than one input to be moved at a time. To this end, instead of a single late signal, the method allows identification of plural late signals to be moved from module inputs to multiplexer control inputs. In this case, the lateness determination partitions the set of inputs into two mutually exclusive, non-empty, non-exhaustive subsets—one of inputs to remain submodule inputs, and the other to be converted to multiplexer control inputs. Refinements can include modifying the multiplexer by adjusting the number of stages and which inputs are controlling which stages.

The method as described applies to modules with one output. However, it can also be applied to modules with more than one output. The method should be particularly effective in cases where the lateness of the effects of an input on the output are primarily due to lateness arriving at the input. In some cases, changing a multi-output module to correct the timing at one output might adversely affect the timing at another output.

The preferred method for handling multi-output modules designs a module so that it includes plural submodules each with a single output. The described method steps can then be applied to each of these submodules independently. This approach eliminates the problem of a change that impairs the timing at one output while improving the timing at another. Thus, each output can be optimized separately.

As illustrated in FIG. 2, the iterations of method M1 first yield a redesign without adding stages, and under certain conditions require addition of a new stage. Alternatively, the additional stage can be added first, then removed if the timing of the present late signal is not satisfactory. Also, both embodiments can be generated concurrently and compared to select the more favorable one. These and other variations upon and modifications to the illustrated embodiment are provided by the present invention, the scope of which is defined by the following claims. In the claims, words introduced in quotes are mnemonic labels and not words of limitation.

What is claimed is:

1. A computer-implemented method of improving the timing characteristics of an integrated-circuit design including a first combination-logic module, said first combination-logic module having plural module inputs and a module output, said module inputs being arranged to receive respective module input signals, said module output providing a result signal that is a combination-logic function of said module inputs under steady state conditions;

determining a first "last" signal of said module input signals requiring timing advancement; and converting said first combination-logic module to a second combination-logic module having a first combination-logic submodule, a second combination-logic submodule, and a two-input multiplexer, said multiplexer having two multiplexer signal inputs, a multiplexer output, and a control input, said control input being coupled for receiving said first last signal, each of said submodules having a set of one or more inputs coupled for receiving respective ones of said module input signals other than said first last signal, each of said submodules having an output coupled to a respective one of said multiplexer signal inputs, each of said submodules being designed so that its output provides said result under steady state conditions when it is selected as determined by the value of said first last signal.

2. A method as recited in claim 1 further comprising a step of determining whether or not the timing characteristics of said second module are unsatisfactory, and, if unsatisfactory, determining if the timing of said first last signal is at least partially at fault.

3. A method as recited in claim 2 further comprising a step of, if the timing characteristics of said second module are unsatisfactory but not due to the timing of said last signal, determining a second last signal of said module input signals requiring a timing advancement; and converting said second module to a third module, said third module having four combination-logic submodules, each of said four combination-logic submodules having inputs arranged for receiving said input signals other than said first last signal and said second last signal, each of said submodules having a respective output, said third module having a four-input multiplexer with four signal inputs respectively coupled to said outputs of said four combination-logic submodules, said four-input multiplexer having control inputs respectively coupled to said first last signal and to said second last signal, said four-input multiplexer having a multiplexer output, said four submodules being designed so that each outputs said result during steady state conditions when coupled to said multiplexer output as determined by the values of said first last signal and said second last signal.

4. A method as recited in claim 3 wherein said four-input multiplexer is a one-stage multiplexer.

5. A method as recited in claim 4 further comprising a step of determining whether or not the timing characteristics of said third module are unsatisfactory due at least in part to the timing of said first last signal.

6. A method as recited in claim 5 further comprising a step of, if the timing characteristics of said third module are unsatisfactory due at least in part to the timing of said first last signal, converting said four-input multiplexer to a two-stage multiplexer in which the first stage is controlled by said second last signal and the second stage is controlled by said first last signal.

7. A method as recited in claim 6 further comprising a step of determining whether or not the timing characteristics of said third module with said two-stage multiplexer are satisfactory, and if not, whether the failure is due to the timing of said second last signal.

8. A method as recited in claim 7 comprising a Nth iteration, where N>2, said Nth iteration comprising the steps of:

terminating if N>P−T, where P is the number of inputs to said first module and T is a predetermined iteration threshold such that $0 \leq T < P$;

determining an Nth last signal;

converting an Nth module with an Nth multiplexer with M<N stages to an (N+1)st module with a (N+1)st multiplexer having M stages so that the Nth last signal serves as a control input to the first stage of said (N+1)st multiplexer;

terminating if the timing characteristics of said (N+1)st module are satisfactory, or if the timing characteristics of said (N+1)st module are unsatisfactory in part due to the lateness of said Nth last signal;

beginning an (N+1)st iteration if the timing characteristics of said (N+1)st module are unsatisfactory but not due to an input to said (N+1)st multiplexer;

redesigning said (N+1)st multiplexer by adding a new first stage controlled solely by said Nth last signal if the timing characteristics of said (N+1)st module are unsatisfactory in part due to the performance a last signal other than said Nth last signal;

terminating if the timing characteristics of said (N+1)st module with the redesigned multiplexer are satisfactory or are unsatisfactory due to said Nth last signal; and beginning an (N+1)st iteration if the timing characteristics of said (N+1)st module with said designed multiplexer are unsatisfactory but not due to the present or a prior late signal.

9. A method as recited in claim 8 wherein $T \geq P/2$.

10. A computer-implemented method of improving the timing characteristics of an integrated-circuit design including an original combination-logic module, said original combination-logic module having a "module" set of plural module inputs and an original module output, said module inputs being coupled for receiving respective module input signals, said output providing a result that is a combination-logic function of said inputs under steady state conditions;

determining a "late" set of signals the timings of which are to be advanced, said late set being a non-empty, non-exhaustive subset of said module set; and converting said original combination-logic module to a revised combination-logic module, said revised combination-logic module having plural combination-logic submodules and a multiplexer, said multiplexer having a multiplexer output, plural multiplexer signal inputs, and a set of mulitplexer control inputs, said control inputs being respectively coupled receiving signals of said late set of signals, each of said submodules having an output coupled to a respective one of said mulitplexer signal inputs, each of said submodules having at least one input of said "module" set, each of said submodules being designed so that it provides said result under steady state conditions when coupled to said multiplexer output as determined by a respective combination of values of said "late" set of signals.

11. A computer-implemented method of improving the timing characteristics of an integrated circuit design including a first combination-logic module, said combination-logic module having P plural module inputs and a module output, said combination-logic module inputs being arranged to receive respective module input signals, said module output providing a result signal that is a combination-logic function of said module inputs under steady state conditions, the integrated circuit design being adapted for undergoing N iterations where N>2, the method comprising;

terminating if N>P−T, where T is a predetermined iteration threshold such that 0<T< determining an Nth last signal of said P plural module input signals requiring timing advancement;

converting the first combination-logic module to a second combination-logic module having a first combination-logic submodule, a second combination-logic submodule, and a two-input multiplexer, said multiplexer having two multiplexer signal inputs, a multiplexer output, and a control input, said control input being coupled for receiving a first last signal of the Nth last signal, each of said submodules having a set of one or more inputs coupled for receiving respective ones of said module input signals other than said first last signal, each of said submodules having an output coupled to a respective one of said multiplexer signal inputs, each of said submodules being designed so that its output provides said result under steady-state conditions when it is selected as determined by the value of said first last signal;

converting an Nth combination-logic module with an Nth multiplexer with M<N stages to an (N+I)st module with a (N+1)st multiplexer having M stages so that the Nth last signal serves as a control input to the first stage of said (N+I)st multiplexer;

terminating if the timing characteristics of said (N+I)st module are satisfactory;

terminating if the timing characteristics of said (N+1)st module are unsatisfactory in part due to the lateness of said Nth last signal;

beginning an (N+1)st iteration if the timing characteristics of said (N+I)st module are unsatisfactory but not due to an input to said (N+I)st multiplexer;

redesigning said (N+1)st multiplexer by adding a new first stage controlled solely by said Nth last signal if the timing characteristics of said (N+1)st module are unsatisfactory in part due to the performance a last signal other than said Nth last signal;

terminating if the timing characteristics of said (N+I)st module with the redesigned multiplexer are satisfactory;

terminating if the timing characteristics are unsatisfactory due to said Nth last signal; and beginning an (N+1)st iteration if the timing characteristics of said (N+1)st module with said designed multiplexer are unsatisfactory but not due to the present or a prior late signal.

* * * * *